United States Patent [19]

Lueker

[11] 4,403,183
[45] Sep. 6, 1983

[54] ACTIVE VOLTAGE PROBE

[75] Inventor: Jonathan C. Lueker, Portland, Oreg.

[73] Assignee: Tektronix, Inc., Beaverton, Oreg.

[21] Appl. No.: 252,749

[22] Filed: Apr. 10, 1981

[51] Int. Cl.$^3$ ............................................. G01R 31/02
[52] U.S. Cl. .................................... 324/72.5; 330/151; 307/494
[58] Field of Search ...................... 324/72, 72.5, 158 P, 324/149, 457, 458, 95, 123 R, 140; 307/494; 330/255, 258, 151

[56] References Cited

U.S. PATENT DOCUMENTS 3,256,484 6/1966 Terry ................................. 324/72.5
3,533,004 10/1970 Embley ................................. 330/151

Primary Examiner—Michael J. Tokar
Assistant Examiner—Kevin D. O'Shea
Attorney, Agent, or Firm—George T. Noe

[57] ABSTRACT

An active voltage probe receiving a DC power voltage via an outer conductor of a coaxial cable is disclosed. The probe includes a differential amplifier with inputs connected to input and reference terminals via DC paths and a follower amplifier with an input connected to the input terminal via an AC path. Outputs currents from the differential and follower amplifiers are applied to an inner conductor of the coaxial cable.

7 Claims, 1 Drawing Figure

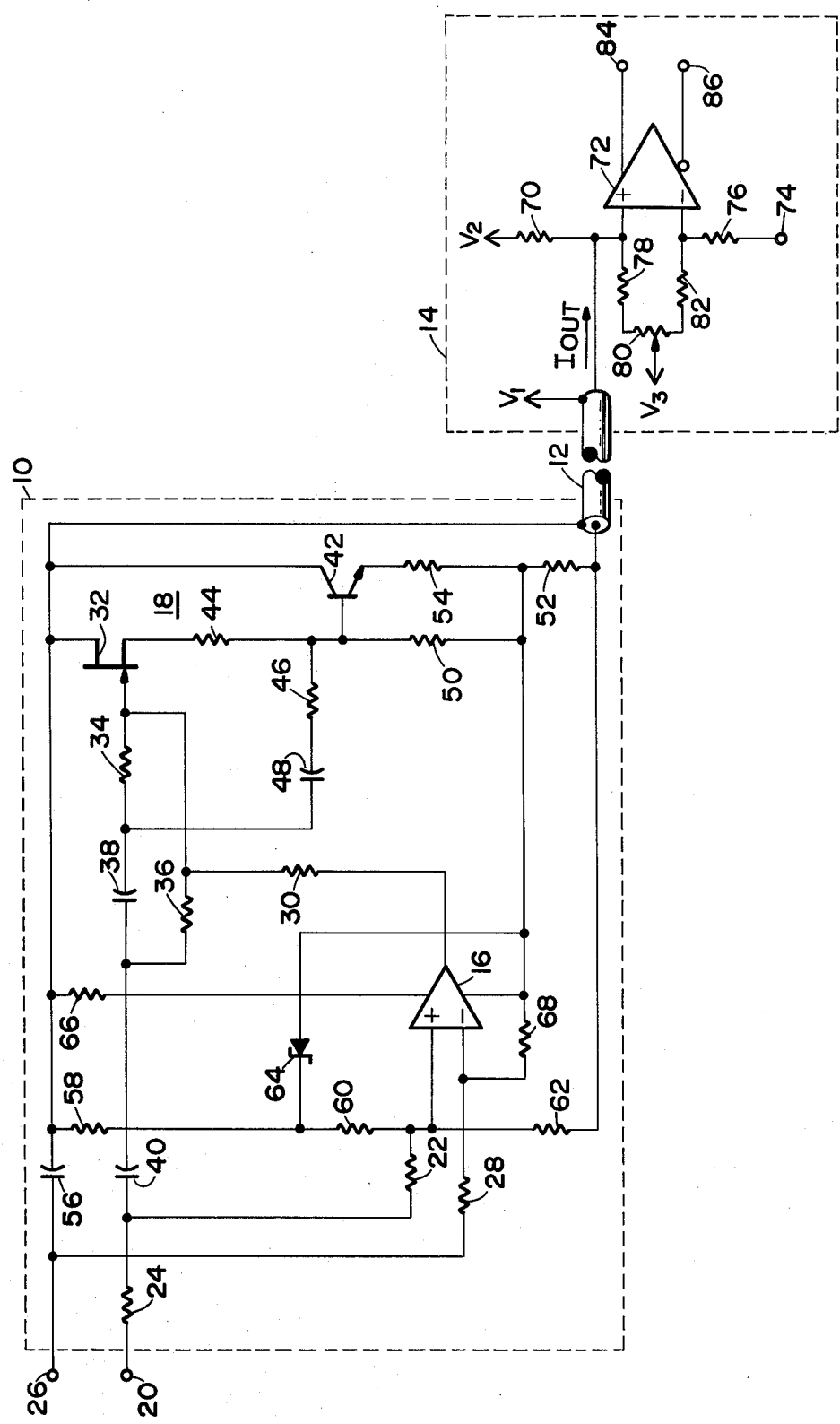

ACTIVE VOLTAGE PROBE

BACKGROUND OF THE INVENTION

The present invention relates to an active voltage probe for an electronic measurement instrument.

Active voltage probes provide a better method of coupling high speed signals to an electronic measurement instrument, such as an oscilloscope or a logic analyzer, than passive probes can provide. The active voltage probe has higher input impedance with less attenuation than a passive voltage probe. Its use extends the measurement capabilities of the probe-instrument combination. There are two types of active voltage probes: (1) a cathode follower probe and (2) a source follower probe, with the source follower version being more popular.

Conventional active voltage probes have three basic parts; a probe head, a cable and termination box. The probe head includes a source follower amplifier to receive a signal from a probe tip, and an output from the source follower is transmitted to an output amplifier of the termination box through the cable. Since the active devices of the probe head receive power from the termination box through an additional conductor in the cable, the conventional active probe is bulky in construction. Moreover, both signal and power voltage connectors are needed on a panel of the measurement instrument. When many probes are necessary to simultaneously measure a plurality of parameters of components such as integrated circuits, it is difficult to connect the required probes to the test points or component leads in a compact area, and hence more panel area of the instrument is necessary for the power voltage connectors. In addition, prior art probes are not isolated from instrument ground and therefore cannot measure a voltage (floating voltage) with respect to non-zero reference voltage.

SUMMARY OF THE INVENTION

According to the present invention, an active circuit of a probe head is a floating-voltage circuit which receives a power voltage through an outer conductor, for example, a shield member of coaxial cable. At a termination box or a measurement instrument, an offset voltage is applied to a signal path or an inner conductor of the coaxial cable for compensating a reference voltage. The probe head includes a differential amplifier with non-inverting and inverting inputs connected to input (probe tip) and reference terminals through DC paths for DC and low frequency components of an input signal to be measured, and a follower amplifier connected to the input terminal through an AC path for middle and high frequency components of the input signal. Outputs from the differential and follower amplifiers are mixed and applied to the inner conductor of the coaxial cable. The follower amplifier is a source follower or a combination of the source follower and an emitter follower.

It is therefore one object of the present invention to provide an active voltage probe which does not need an additional power conductor for an active circuit in a probe head.

It is another object to provide an active voltage probe which can detect signals from both grounded and floating-voltage circuits.

It is a further object to provide an active voltage probe allowing significant reductions in assembly cost and physical size.

It is an additional object to provide an active voltage probe which does not require a complex circuit and an additional connector to a termination box or a measurement instrument.

This invention is pointed out with particularity in the appended claims. A more thorough understanding of the above and further objects and advantages of this invention may be obtained by referring to the following description taken in conjunction with the accompanying drawings.

FIGURE

A single drawing shows an active voltage probe of one preferred embodiment according to this invention.

DETAILED DESCRIPTION OF THE INVENTION

Referring to the drawing, there is shown a circuit schematic of one embodiment according to this invention. An active voltage probe comprises probe head 10, coaxial cable 12, and output circuit 14 which may be in a termination box or a measurement instrument. Probe head 10 includes differential or operational amplifier 16 and source and emitter follower amplifier 18. A non-inverting input of operational amplifier 16 is connected to input terminal 20 through large resistor 22 and small resistor 24, and an inverting input thereof is connected to reference terminal 26 through large resistor 28. An output of amplifier 16 is connected through large resistor 30 to a gate of field effect transistor (FET) 32 which is connected to the common junction of resistors 22 and 24 through small resistor 34, large resistor 36, and capacitors 38 and 40. A drain of FET 23 and a collector of NPN transistor 42 are connected to an outer conductor of coaxial cable 12. Resistor 44 is inserted between a source of FET 32 and a base of transistor 42 which is connected through resistor 46 and capacitor 48 to the common junction of resistor 34 and capacitor 38 and further connected through resistors 50 and 52 to an inner conductor of coaxial cable 12. Resistor 54 is inserted between an emitter of transistor 42 and the common junction of resistors 50 and 52. Capacitor 56 is inserted between the outer conductor of coaxial cable 12 and reference terminal 26, and a series circuit consisting of resistors 58, 60 and 62 is connected between the outer and inner conductors of coaxial cable 12 wherein the common junction of resistors 58 and 60 is connected to the common junction of resistors 52 and 54 through Zener diode 64, and the common junction of resistors 60 and 62 is connected to the non-inverting input of operational amplifier 16. Positive and negative power voltage terminals of operational amplifier 16 are connected to the outer connector of coaxial cable 12 through resistor 66 and the common junction of resistors 50 and 52, respectively. Resistor 68 is inserted between the inverting input and negative power voltage terminal of operational amplifier 16. The circuit in probe head 10 can be implemented as a hybrid.

In output circuit 14, the outer conductor of coaxial cable 12 is connected to voltage source $V_1$, and the inner conductor thereof is connected to voltage source $V_2$ through termination resistor 70 and further connected to a non-inverting input end of comparator 72. Voltage $V_1$ is higher than voltage $V_2$. It should be noted that this embodiment is used in a logic analyzer. An inverting input receives a threshold level from terminal 74 through resistor 76. A series circuit consisting of resistor 78, potentiometer 80 and resistor 82 is inserted between the non-inverting and inverting inputs of comparator 72, and a center tap of potentiometer 80 receives voltage $V_3$. A push-pull output of comparator 72 is applied to terminals 84 and 86.

Input terminal 20 detects a signal to be measured from a test point of a PUT (product under test), and reference terminal 26 is connected to a reference potential of the PUT. Operational amplifier 16, FET 32 and transistor 42 receive their operation voltages from voltage source $V_1$ through the outer conductor of coaxial cable 12. Since voltage $V_1$ is a DC voltage, there is no problem with regard to the outer conductor acting as a shield. At middle and high frequency components of the input signal, reference input terminal 26 acts as AC ground, and these frequency components pass through resistor 24 and capacitor 40. The high frequency component of the input signal is divided by capacitors 38–48 and floating and inter-electrode capacitances at the gate of FET 32 and the base of transistor 42. The divided high frequency component is amplified by FET 32 and transistor 42 respectively functioning as source and emitter follower amplifiers, and the output currents therefrom are applied to the inner conductor of coaxial cable 12 through resistor 52.

The middle frequency component of the input signal is divided by capacitors 38–40, floating and inter-electrode capacitances at the gate of FET 32 and the base of transistor 42, and resistors 30–36. The divided middle frequency component is amplified by source follower/emitter follower amplifiers 18, and the output currents therefrom are applied to the inner conductor of coaxial cable 12.

The DC and low frequency components of the input signal are applied to the non-inverting input of operational amplifier 16 through input terminal 20 and resistor 24–22, and a different voltage between the reference potential at terminal 26 and the DC and low frequency components is obtained at the output of amplifier 16. It should be noted that a general operational amplifier is for DC and low frequency signals and is not suited for middle and high frequency signals. The output from operational amplifier 16 is applied to the inner conductor of coaxial cable 12 through resistor 30 and source follower/emitter follower amplifiers 18. The signal at the common junction of resistors 50 and 54 is fed back to the inverting input of operational amplifier 16 through feedback resistor 68. The DC bias and low frequency gain is set by operational amplifier 16, resistors 22-28-52-60-62-68 and Zener diode 64. This Zener diode is present in order to provide the current offset required to bias the probe. Terminals 20 and 26 can be connected to the floating circuit because of differential amplifier 16. Since the negative voltage terminal of amplifier 16 is connected to the common junction of resistors 50 and 52, amplifier 16 is floated, and the operation characteristic thereof is improved.

The high, middle and low frequency gains and the DC gain are set to be equal. When the difference voltage $(V_{20}-V_{26})$ between terminals 20 and 26 is zero, output current $I_{out}$ flowing through resistor 52 and the inner conductor of coaxial cable 12 is the bias current $I_o$ determined by Zener diode 64 and other components. When the difference voltage between terminals 20 and 26 is V (positive or negative), output current $I_{out}$ is $I_o+(V/R_o)$, wherein $R_o$ is determined by the gains of the amplifiers in probe head 10. Output current flows to resistor 70, and a voltage across resistor 70 is $R_{70}[I_o+(V/R_o)]$, wherein $R_{70}$ is the resistance of resistor 70. Since resistor 70 receives voltage $V_2$ the voltage generated by $R_{70}$. $I_o$ is cancelled, and only the signal component voltage between terminals 20 and 26 is applied to the non-inverting input of comparator 72. Resistors 78-80-82 comprise a DC balance circuit. In this embodiment, the measurement instrument is a logic analyzer, and comparator 72 compares the corresponding input voltage with the threshold voltage from terminal 74. The push-pull output signal at terminals 84 and 86 is applied to a main circuit of the logic analyzer. If the measurement instrument is an oscilloscope, the common junction of resistor 70 and the inner conductor of coaxial cable 12 may be connected to a buffer amplifier. A conventional coaxial connector can be used for the connection between coaxial cable 12 and output circuit 14.

While I have shown and described herein the preferred embodiment of my invention, it will be apparent to those skilled in the art that many changes and modifications may be made without departing from my invention in its broader aspects.

I claim:

1. An active voltage probe, comprising:
    a probe head including a differential amplifier with inputs connected to input and reference terminals through DC paths, and follower amplifier means with an input connected to said input terminal through an AC path;
    a coaxial cable including an inner conductor for transmitting output currents from said differential amplifier and said follower amplifier means, and an outer conductor for applying a DC power voltage to said differential amplifier and said follower amplifier means; and
    an output circuit connected to the opposite end of said coaxial cable, wherein said outer conductor is connected to a DC power voltage source and said inner conductor is connected to a termination resistor.

2. An active voltage probe according to claim 1 wherein the output from said differential amplifier is applied to the input end of said follower amplifier means.

3. An active voltage probe according to claim 1 wherein said differential amplifier and said follower amplifier means are implemented as a hybrid circuit.

4. An active voltage probe according to claim 1 wherein the other end of said termination resistor receives a bias voltage to cancel bias currents from said probe head.

5. An active voltage probe according to claim 1 wherein said coaxial cable is connected to said output circuit via a coaxial connector.

6. An active voltage probe according to claim 1 wherein said follower amplifier means comprises a source follower amplifier.

7. An active voltage probe according to claim 1 wherein said follower amplifier means comprises a combination of a source follower amplifier and an emitter follower amplifier.

* * * * *